United States Patent [19]
Sasaki et al.

[11] Patent Number: 6,087,072
[45] Date of Patent: Jul. 11, 2000

[54] ARTICLE HAVING A LIGHT-CONTROLLABLE SUPER-WATER-REPELLENT SURFACE AND A PRINTING MACHINE USING THE ARTICLE

[75] Inventors: Hiroshi Sasaki, Tokai-mura; Mitsuyoshi Shouji, Jyuou-machi; Kenichi Kawashima, Hitachinaka; Yutaka Ito, Takahagi, all of Japan

[73] Assignee: Hitachi, Ltd., Tokyo, Japan

[21] Appl. No.: 09/365,869

[22] Filed: Aug. 3, 1999

Related U.S. Application Data

[63] Continuation of application No. 08/940,951, Oct. 8, 1997, Pat. No. 6,027,852.

[30] Foreign Application Priority Data

Oct. 11, 1996 [JP] Japan .................................. 8-269636

[51] Int. Cl.$^7$ ...................................................... G03F 7/09
[52] U.S. Cl. ........................ 430/300; 430/302; 430/270.1; 430/271.1; 101/453; 101/456
[58] Field of Search .............................. 430/220.1, 271.1, 430/300, 302, 320; 101/453, 456

[56] References Cited

U.S. PATENT DOCUMENTS

| | | | |
|---|---|---|---|
| 4,565,759 | 1/1986 | Tsutsui ........................................ | 430/66 |
| 4,634,659 | 1/1987 | Esumi et al. ............................. | 430/302 |
| 4,686,169 | 8/1987 | Yoshino et al. .......................... | 430/339 |
| 5,102,771 | 4/1992 | Vogel et al. .......................... | 430/270.1 |
| 5,380,622 | 1/1995 | Roser ....................................... | 430/325 |
| 5,482,768 | 1/1996 | Kawasato et al. ....................... | 428/327 |
| 5,599,489 | 2/1997 | Saiki et al. ................................ | 264/83 |
| 5,728,758 | 3/1998 | Smith ....................................... | 524/265 |

*Primary Examiner*—Janet Baxter
*Assistant Examiner*—Yvette M. Clarke
*Attorney, Agent, or Firm*—Antonelli, Terry, Stout & Kraus, LLP

[57] ABSTRACT

The present invention relates to an article with a surface having an contact angle with water of at least 150° or more in which the contact angle with water on the surface is lowered to less than 150° by photo-irradiation to the surface. According to the present invention, it is possible to control the super-water-repellency of an article with a super-water-repellent surface by photo-irradiation.

6 Claims, 3 Drawing Sheets

ARTICLE HAVING A LIGHT-CONTROLLABLE SUPER-WATER-REPELLENT SURFACE AND A PRINTING MACHINE USING THE ARTICLE

This application is a Continuation application of application Ser. No. 08/940,951, now U.S. Pat. No. 6,027,852, filed Oct. 8, 1997.

FIELD OF THE INVENTION

The present invention relates to an article having a super-water-repellent surface and a printing machine using the article as material for an original plate for printing or a photoreceptor for laser printer.

BACKGROUND OF THE INVENTION

For preparing a water repellent surface, a treatment of coating or deposition, on the surface, a highly water repellent material, for example, a higher fatty acid, fluoro-containing higher fatty acid or wax is usually conducted. This treatment can provide an contact angle with water to about 80 to 120° for a smooth surface to be treated. By utilizing such a water repellent nature, water repelling technique has been applied generally to a wide variety of fields such as umbrellas, window glass of cars, roofs and parabola antennas.

For further increasing the contact angle, it is possible to provide a greater contact angle by forming appropriate roughness on the surface to be coated with the material described above. The contact angle with water of the surface can be increased to 150° or more by such a method.

Generally, if the contact angle with water is 150° or more, the surface is referred to as super-water-repellent. Since water assumes a form of a nearly spherical shape on the surface, if the surface is slanted slightly, such water sphere tumbles down like a glass bead. Further, when an article with a surface showing the super-water-repellency is placed in water, the super-water-repellent surface forms a mirror face depending on the angle observed. As an example of showing super-water-repellency, there can be mentioned, for example, plant leaves. Most of plant leaves keep the contact angle with water at 150° or more due to roughness of a wax on the surface and we often observe that water droplets such as dewdrops tumble down from leaves.

By utilizing this phenomenon, it has been studied to make evaporator fins of air conditioners or radio antennas.

SUMMARY OF THE INVENTION

By the way, if the super-water-repellent surface can be partially formed or eliminated, that is, if the super-water-repellency on the surface can be controlled, it will be significant for the extension of the applicable field such as for enhancement in the high quality in printing using an aqueous ink or fine fabrication technique of photoresist. If such control is possible, when photo-irradiation is performed partially to the super-water-repellent surface to lower the water repellency for instance, a difference is caused in the adhesion of the aqueous ink between the repellency-lowered part and the super-water-repellent part. That is, latent images due to the difference of the water repellency are formed. Then, a printing machine using such material as a photoreceptor can be constituted. Further, when an aqueous resin is adhered on the latent images and dried, the part is raised by so much as the adhesion of the resin to constitute an original plate for a printing machine. Control of the super-water-repellency by photo-irradiation is important in the development of novel printing techniques described above. Further, the principle is applicable also to the control of the oil repellency and the use of an oil ink is also enabled.

An object of the present invention is to control the super-water-repellency of an article having a super-water-repellent surface by light.

The present inventors have found that upon forming the super-water-repellent surface, the super-water-repellency on the surface of the article can be controlled by using a photochromic compound or a material forming an acid or base by light-irradiation, that is, a material having photo-sensitivity in some or other meanings. The summary of the present invention for attaining the foregoing object are as described below.

(1) An article with a surface having an contact angle with water of at least 150° or more in which the contact angle with water on the surface is lowered to less than 150° by photo-irradiation to the surface.

(2) An article as defined in (1) above, wherein the photo-irradiation for changing the contact angle of the article is a UV at a wavelength of less than 400 nm.

(3) An article as defined in (1) or (2) above, wherein a photochromic compound is coated on the surface of the article, the contact angle with water on the surface being lowered to less than 150° by photo-irradiation.

(4) An article as defined in (3) above, wherein the photochromic compound is a triphenylmethane derivative.

(5) An article as defined in any one of (1) to (4) above, wherein a compound forming an acid or base by undergoing the photo-irradiation is coated on the surface of the article, the contact angle with water on the surface being lowered to less than 150° by photo-irradiation.

(6) An article as defined in (1) or (2) above, wherein a photochromic compound is contained in a material forming the surface of the article, the contact angle with water on the surface being lowered to less than 150° by photo-irradiation.

(7) An article as defined in (6) above, wherein the photochromic compound is an azobenzene derivative.

(8) An article as defined in any one of (1) to (7) above, wherein two or more kinds of fine particles are dispersed in the material forming the surface of the article, the contact angle with water on the surface being lowered to less than 150° by photo-irradiation, and wherein the average grain size of smallest particles among them is from $1/50$ to $1/1000$ of the average grain size of largest particles.

(9) An article as defined in (8) above, wherein the material for the fine particles of smaller average grain size comprises silicon oxide, aluminum oxide or titanium oxide.

(10) An article as defined in any one of (1) to (9) above, wherein a fluoro compound represented by the following formulae is contained in a material forming the surface of the article, the contact angle with water on the surface being lowered to less than 150° by photo-irradiation:

$$Rf-(R)z$$

Rf: having the following structure

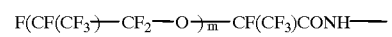
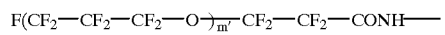

or

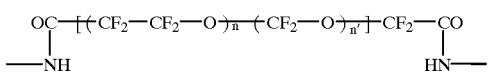

R: having the following structure

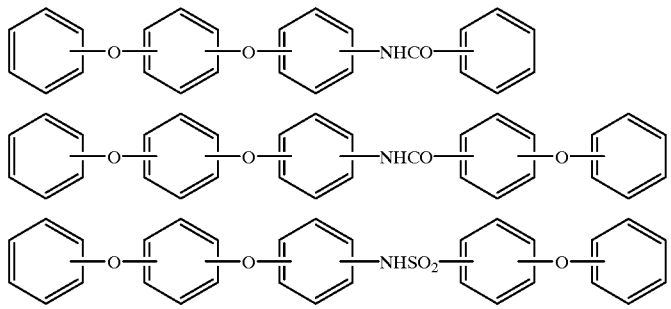

or

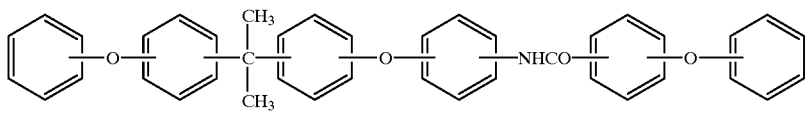

Z: 1 or 2.

(11) An article as defined in any one of (1) to (10) above, wherein, in the surface of the article having an contact angle with water lowered to less than 150° by the photo-irradiation, the contact angle with water on the surface is lowered to less than 150° by the photo-irradiation and then the contact angle with water on the surface is increased to 150° or more by application of heat at 100° C. or higher.

(12) An article as defined in (11) above, wherein, in the surface of the article having an contact angle with water lowered to less than 150° by the photo-irradiation, the contact angle with water on the surface is lowered to less than 150° by the photo-irradiation, and then the contact angle with water on the surface is increased to 150° or more by visible-irradiation at a wavelength of 400 nm or more and then heating the surface at 100° C. or higher.

(13) An article as defined in (11) above, wherein, in the surface of the article having an contact angle with water lowered to less than 150° by the photo-irradiation, the contact angle with water on the surface is lowered to less than 150° by the photo-irradiation, and then the contact angle with water on the surface is increased to 150° or more by bringing an aqueous solution at pH of 13 or higher into contact with the surface and then application of heating at 100° C. or higher to the surface.

(14) A printing machine using, as an original plate or a photoreceptor, a material with a surface having an contact angle with water before photo-irradiation of at least 150° or more, the contact angle with water being lowered to less than 150° by photo-irradiation.

(15) A printing machine as defined in claim (14) above, wherein the irradiation wavelength for changing the contact angle on the surface of the original plate or the photoreceptor of the printing machine is a UV at a wavelength of less than 400 nm.

(16) A printing machine as defined in (14) or (15) above, wherein a photochromic compound is coated on the original plate or the photoreceptor of the printing machine.

(17) A printing machine as defined in (16) above, wherein the photochromic compound is a triphenylmethane derivative.

(18) A printing machine as defined in (14) or (15) above, wherein a compound forming an acid or base by undergoing the photo-irradiation is coated on the original plate or the photoreceptor of the printing machine.

(19) A printing machine as defined in (14) or (15) above, wherein a photochromic compound is contained in a material forming the original plate or the photoreceptor of the printing machine.

(20) A printing machine as defined in (19) above, wherein the photochromic compound is an azobenzene derivative.

(21) A printing machine as defined in any one of (14) to (20) above, wherein two or more kinds of fine particles are dispersed in the material forming the original plate or the photoreceptor of the printing machine, and wherein the average grain size of smallest particles among them is from 1/50 to 1/1000 of the average grain size of largest particles.

(22) A printing machine as defined in (21) above, wherein the material for the fine particles of a smaller average grain size comprises silicon oxide, aluminum oxide or titanium oxide.

(23) A printing machine as defined in any one of (14) to (22) above, wherein a fluoro compound represented by the following formulae is contained in a material forming the original plate or the photoreceptor of the printing machine:

Rf-(R)z

Rf: having the following structure

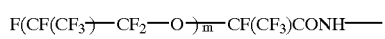

-continued

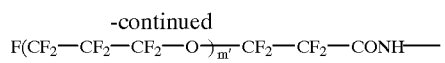

or

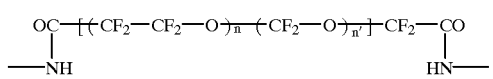

R: having the following structure

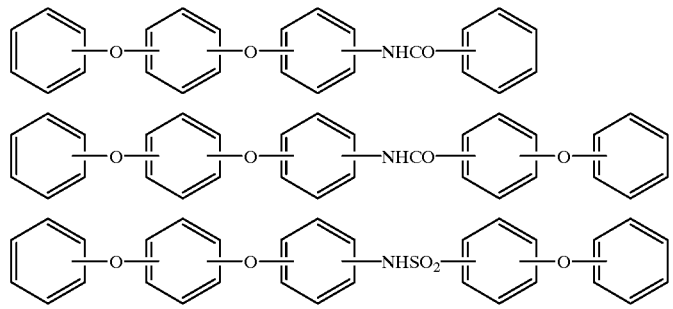

or

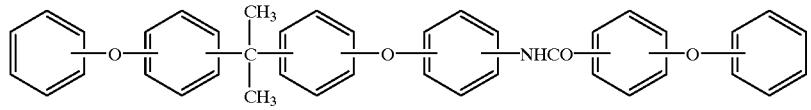

Z: 1 or 2.

(24) A printing machine as defined in any one of (14) to (23) above, wherein the contact angle with water on the surface of the original plate or the photoreceptor of the printing machine is lowered to less than 150° by the photo-irradiation and then the contact angle with water on the surface is increased to 150° or more by application of heat at 100° C. or higher.

(25) A printing machine as defined in (24) above, wherein in the original plate or the photoreceptor of the printing machine having an contact angle with water lowered to less than 150° by the photo-irradiation, the contact angle with water on the surface is lowered to less than 150° by the photo-irradiation and then the contact angle with water on the surface is increased to 150° or more by visible-irradiation at a wavelength of 400 nm or more and then application of heat at 100° C. or higher to the surface.

(26) A printing machine as defined in (24) above, wherein in the surface of the original plate or the photoreceptor of the printing machine having an contact angle with water lowered to less than 150° by the photo-irradiation, the contact angle with water on the surface is lowered to less than 150° by the photo-irradiation and then the contact angle with water on the surface is increased to 150° or more by bringing an aqueous solution at pH of 13 or higher into contact with the surface and then heating the surface at 100° C. or higher.

EXPLANATION FOR REFERENCE NUMERALS

Figure 1:
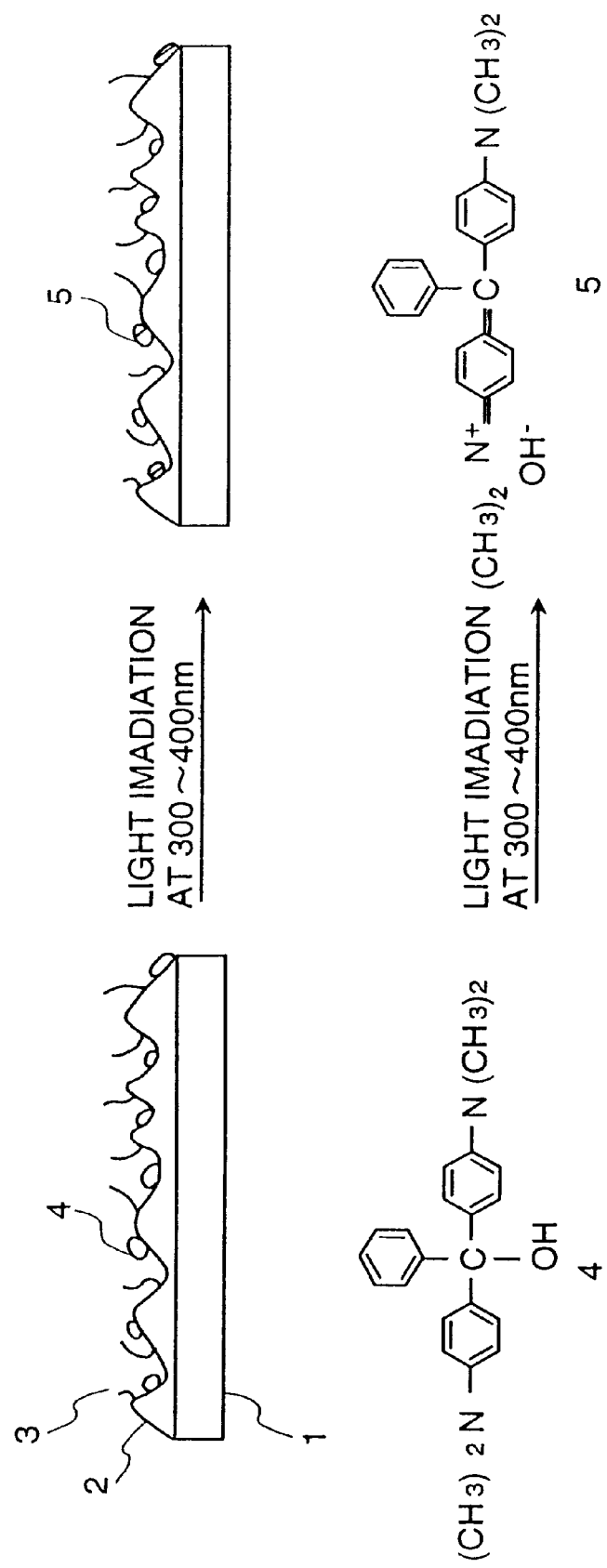
FIG. 1 is a conceptional view for a mechanism showing the change of the water repellency on the surface of an article according to the present invention.

1 . . . article
2 . . . film forming a super-water-repellent surface
3 . . . perfluoropolyether
4 . . . [4-(diamino)phenyl]phenyl methanol
5 . . . isomer of 4
6 . . . esterification product of polyvinyl alcohol and 4-carboxyazobenzene (azobenzene unit: transform)
7 . . . cis form of 6
8 . . . glass plate with super-water-repellent surface
9 . . . mask
10 . . . methyl orange solution
11 . . . light source (laser, lamp, etc.)
12 . . . mirror
13 . . . photoreceptor
14 . . . ink drum
15 . . . ink pool
16 . . . paper conveying belt
17 . . . roll for paper conveying belt
18 . . . paper
19 . . . sponge for cleaning photoreceptor
20 . . . drier
21 . . . blower
22 . . . air intake for blower

DETAILED DESCRIPTION OF THE INVENTION

1. Concept and Constitution of the Present Invention

Various means may be considered for the method of forming a surface the super-water-repellency of which is controlled by photo-irradiation in an article according to the present invention, and two examples (the following (1) and (2)) are illustrated for explaining the concept and the constitution of the present invention.

(1) Method of Forming a Layer of a Photosensitive Material on a Super-Water-Repellent Surface At first, a fine powder for forming roughness on a surface, a fluoro compound for improving the water repellency on the surface, and a resin as a matrix of them are suspended in a solvent. In this case, a small amount of a surfactant is added for improving the dispersibility of the fine powder. The liquid suspension is coated on the surface of the article intended to provide super-water-repellency and then the solvent is evaporated, for example, by heating or depressurization. In a case of using a thermosetting resin, heating is applied at a temperature necessary for curing for a required period of time. By optimizing the grain size and the blending amount of the fine powder, the kind and the blending amount of the fluoro compound, the kind and the blending amount of the resin and the type of the solvent used, the surface shows the super-water-repellency. As optimized examples, those materials to be described later or those shown in the examples can be mentioned. Depending on the material, a method of forming a rough surface using a liquid suspension not mixed with the fluoro compound and then coating the fluoro compound thereon may also be used.

Then, a layer of the photosensitive material such as a photochromic compound, an acid generator or a base generator is formed on the super-water-repellent surface by coating or vapor deposition. In a case of forming the layer by coating, it is necessary to evaporate the solvent, for example, by heating or depressurization. Also in this case, it is necessary to control the coating concentration of the coating suspension, the kind of the solvent for the coating or the evaporation speed. If the coating concentration is excessively high or the evaporation speed is too fast, the surface after coating exhibits no more super-water-repellency. Then, an aimed surface the super-water-repellency of which is controlled by the photo-irradiation can thus be formed.

(2) Method of Incorporating a Photosensitive Material into a Material for Forming Super-Water-Repellent Surface When a super-water-repellent surface is formed by the method (1) above, the super-water-repellent surface that is controlled by light can be formed also by mixing the photosensitive material together in a liquid suspension containing the fine powder, the fluoro compound and the resin and then coating the mixture on the surface of the article and drying the same.

The reason why the water repellency on the surface formed by the method (1) or (2) is lowered by the photo-irradiation is estimated as below. (1) and (2) are merely examples estimated herein and the present invention is not restricted only to them.

At first, FIG. 1 is a conceptional view for the surface formed by the method (1).

This is an example of using, as the photosensitive material, bis[4-(dimethylamino)phenyl]phenyl methanol in malachite green derivatives as one of triphenyl methane series derivatives. In this case, a perfluoropolyether having an alkyl chain at the terminal is used for the fluoro compound and an epoxy resin is used for the resin.

The super-water-repellent surface is formed with a resin containing a fine powder and the surface is not smooth but rough. Further, it is assumed that the water repellency is obtained by the perfluoropolyether anchored at the alkyl chain in the epoxy resin while exposed at the perfluoropolyether chain on the surface. If bis[4-(dimethylamino)phenyl] phenyl methanol is coated on the material, since the perfluoropolyether chain has also oil repellency, it does not form a uniform membrane but is coated unevenly. When an UV at a wavelength of 300–400 nm is irradiated to bis[4-(dimethylamino)phenyl]phenyl methanol, it releases hydroxyl groups as shown in the figure and amino groups are quaternerized to form a salt structure. Structural change causes the increasing hydrophilicity of the compound. It may be considered that the change of the compound contributes the decreasing the water repellency on the surface.

Figure 2:
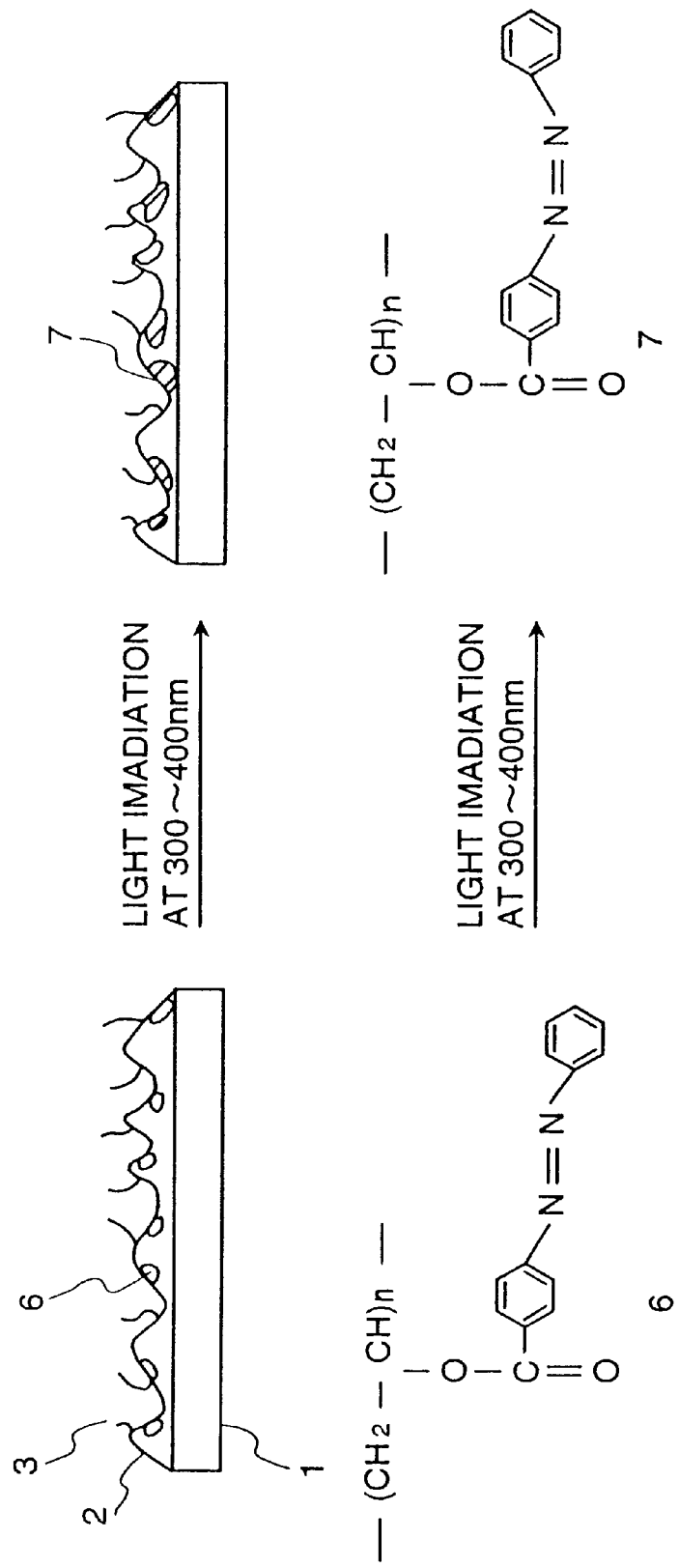
FIG. 2 is a conceptional view for a mechanism showing the change of the water repellency on the surface of an article according to the present invention.

FIG. 2 is a conceptional view on the surface formed by the method (2).

This is an example of using a compound formed by ester bonding of 4-carboxyazobenzene with hydroxyl groups of polyvinyl alcohol as a photosensitive material. Also in this case, a perfluoroether having an alkyl chain at the terminal is used for the fluoro compound and an epoxy resin is used for the resin. When a UV at a wavelength of 300–400 nm is irradiated to a polymer having azobenzene, the azobenzene residue is isomerized into a cis form as shown in the figure. This is accompanied by volume expansion, to change the surface roughness (assumed to be flattened to some extent) and the surface repellency is lowered entirely by the change. Further, since the hydrophilicity of azobenzene is higher in the cis form than in the transform, it is estimated that this structural effect also contributes to the lowering of the water repellency.

In addition to (1) and (2) described above, it may be also considered possible to form an aimed surface by replacing the epoxy resin with a polymer having a photosensitive residue or using a fluoro compound having a photosensitive residue on the terminal of the perfluoropolyether, without mixing or coating other photochromic compound on the super-water-repellent surface.

2. Material for Forming the Surface of an Article according to the Present invention The material for forming the surface of the article according to the present invention will be described at first.

Photosensitive material will at first be explained.

The irradiation wavelength chooses sensitive region of using photosensitive material. In usual circumstances, visible or near-UV within a range from 400 to 900 nm are predominant during day times. When a super-water-repellent surface containing a material having sensitivity to a light in such a wavelength is left as it is, the super-water-repellency may be lost. In view of the above, if such a material is used, light shielding or like other countermeasure is necessary for the surface. Use of a material not having a sensitivity to the wavelength of 400 to 900 nm, the requirement for the countermeasure is moderated. Since most of photochromic materials such as spiropyran or triphenyl methane require a light at a wavelength of 400 nm or less for isomerization, the requirement for the countermeasure is moderated. Among the photochromic materials, some of materials such as azobenzene derivatives or spiropyran derivatives have a feature in that isomers formed by the UV-irradiation change their structures into those before UV-irradiation undergoing the visible-irradiation at a wavelength of 400 nm or more. Therefore, in a case of preparing a super-water-repellent surface by using such a photochromic material, even after the water repellency is lowered by the irradiation of the UV, the surface can recover the super-water-repellency by visible-irradiating and eliminating water on the surface by the operation such as heating or the like. Further, most of photochromic materials have a nature that the isomers formed by the photo-irradiation recover their structure before photo-irradiation by heating. Therefore, it is possible, by heating the surface the water repellency of which is lowered, to eliminate water on the surface and recover the structure before photo-irradiation of the photochromic material.

Even if the heating temperature is lower than 100° C., the water on the surface can be removed by heating for a long time. However, rapid water removal is possible by heating to a temperature higher than 100° C. as a boiling point of water in a usual case (1 atm). Further, the heating temperature is further elevated, water can be removed more rapidly.

Further, the triphenyl methane series photochromic materials release hydroxyl groups by the UV-irradiation. However, if the material is in contact with an aqueous alkaline solution such as of sodium hydroxide or potassium hydroxide, it can recover the state before the UV-irradiation. However, among the triphenyl methane derivatives, a compound having a structure in which hydrogen anions is released as in bis[4-(dimethylamino) phenyl]phenyl methane is introduced with hydroxyl groups instead of hydrogen anions if it is in contact with the aqueous alkaline solution. As a result, the compound changes into bis[4-(dimethylamino)phenyl]phenyl methanol. The pH value for the aqueous alkaline solution is desirably 13 or higher at 25° C. If the pH value is lower, it may be a worry that the reaction does not proceed enough to recover the super-water-repellency.

The photochromic compounds can include spiropyran derivatives, triphenyl methane derivatives, 4,5-epoxy-2-cyclopentene derivatives, azobenzene derivatives, fulgide derivatives, thioindigo derivatives, diallylethene derivatives and anthracene derivatives. In a case of forming a layer of a photochromic compound on the super-water-repellent surface by coating or vapor deposition, use of a compound, among them, forming ions in the molecule by the photo-irradiation tends to lower the contact angle more. The compound of this type can include, for example, spiropyran derivatives, triphenyl methane derivatives, and 4,5-epoxy-cyclopentene derivatives. Among them, triphenyl methane derivatives have a trend of bringing about particularly great lowering for the contact angle. Further, amorphous materials, for example the materials having longer alkyl chains tend to coat thicker on the super-water-repellent surface than crystallized materials. By the way, if the material is mixed together with the resin or the like upon forming the super-water-repellent surface, use of a compound bringing about the larger structural change tends to cause more lowering in the contact angle. The compounds of the category can include, for example, azobenzene derivatives, fulgide derivatives, thioindigo derivatives, diallyl ethene derivatives and anthrathene derivatives.

Spiropyran derivatives can include, specifically,
1,3,3-trimethylindolinobenzopyrylospiran,
1,3,3-trimethylindolino-6'-nitrobenzopyrylospiran,
1,3,3-trimethylindolino-6'-bromobenzopyrylospiran,
1-n-decyl-3,3-dimethylindolino-6'-nitrobenzopyrylospiran,
1-n-octadecy-1-3,3-dimethylindolino-6'-nitrobenzopyrylospiran,
3',3'-dimethyl-6-nitro-1'-[2-(phenylcarbamoyl)ethyl]spiro[2H-1-benzopyran-2,2'-indoline],
1,3,3-trimetnylindolino-8'-methoxybenzopyrylospiran, and
1,3,3-trimetnylindolino-β-naphthopyrylospiran.

As the alkyl chain length is increases in the molecule, coating amount to the super-water-repellent surface tends to be increased. Spiropyran compounds are synthesized generally by reacting 1,3,3-trimethylindolenine and an alkyl halide to prepare a form in which a nitrogen atom of indolenine ring and the alkyl group of the alkyl halide are combined to quaternarize the nitrogen atom, with the halogen being as a pair anion and reacting a benzaldehyde derivative therewith. Then, the residual alkyl chain bonded to the nitrogen atom of the hetero ring can be lengthened easily by making the alkyl group in the alkyl halide longer, by which the coating amount to the super-water-repellent surface can be increased even in a case of using a coating solution at a low concentration.

In addition, there can be also mentioned, for example, spirothiopyran derivatives in which an oxygen atom is replaced with a sulfur atom in a ring opened by photo-irradiation or spirooxazine derivatives in which methine is replaced with a nitrogen atom in the ring opened by photo-irradiation.

The triphenylmethane derivatives can include, malachite green derivatives. specifically, there can be mentioned, for example, bis[dimethylamino)phenyl] phenylmethanol, bis[4-(diethylamino)phenyl]phenylmethanol, bis[4-(dibuthylamino)phenyl]phenylmethanol and bis[4-(diethylamino)phenyl]phenylmethane.

The 4,5-epoxy-2-cyclopentene derivatives can include, for example, 2,3-diphenyl-1-indenone oxide and 2',3'-dimethyl-2,3-diphenyl-1-indenone oxide.

As the azobenzene derivatives, those polymers having an azobenzene residue in the molecule are effective in the present invention since they lower the super-water-repellency greatly by photo-irradiation. Such compounds can include, those having azobenzene residues crosslinked to the side chained, specifically, those in which 4-carboxyazobenzene is ester bonded to the hydroxyl group of polyvinyl alcohol or 4-carboxyazobenzene is amide bonded to the amino group of polyallylamine. The azobenzene residues in them are isomerized into a cis form by photo-irradiation at a wavelength of 300–400 nm. This tends to increase the volume of the polymer. There can be also mentioned those having azobenzene residues in the main chain, for example, those formed by ester bonding bis(4-hydroxyphenyl)dimethylmethane (also referred to as bisphenol A) and 4,4'-dicarboxyazobenzene or by ester bonding ethylene glycol and 4,4'-dicarboxyazobenzene. Also, azobenzene residues in them are isomerized into a cis form by photo-irradiation at a wavelength of 300–400 nm. The volume tends to decrease in this case. Also in a case of the thioindigo derivatives, they are also effective since the polymer having the thioindigo structure in the molecule greatly lowers the super-water-repellency by photo-irradiation like that of the azobenzene derivatives. The anthrathene derivatives are also effective since the polymer having the anthrathene structure in the molecule greatly lowers the super-water-repellency like that of the azobenzene derivatives.

The fulgide derivatives can include, specifically, isopropylidene fulgide and adamantylidene fulgide.

Diallylethene derivatives can include, for example,
1,2-dicyano-1,2-bis(2,3,5-trimethyl-4-thienyl)ethene,
2,3-bis(2,3,5-trimethyl-4-thiethyl) maleic anhydride,
1,2-dicyano-1,2-bis(2,3,5-trimethyl-4-selenyl)ethene,
2,3-bis(2,3,5-trimethyl-4-selenyl) maleic anhydride and
1,2-dicyano-1,2-bis(2-methyl-3-N-methylindole)ethene.

As the acid generator, those used for usual photosensitive resin compositions can be mentioned. The basic structures of them can include onium salt, halide, sulfonate, sulfonyl compound and diazonaphthoquinone structures. Specifically, the followings can be mentioned. The onium salt can include, for example, diphenyliodonium trifluoromethane sulfonate and triphenylsulfonium trifluoromethane sulfonate, The halogen compound can include, for example,
2,6-bis(trichloromethyl)-4-(methoxyphenyl)-1,3,5-triazine and
1,3,5-tris(2,3-dibromopropyl)-1,3,5-triazine-2,4,6-(1H, 3H, 5H) trione.

The sulfonate can include, for example, tris(methanesulfonyloxy)benzene, tris(ethanesulfonyloxy)

benzene, α-hydroxymethylbenzoine methyl sulfonate, α-hydroxymethylbenzoine ethyl sulfonate, p-nitrobenzylsulfonyl benzoate, p-nitrobenzylsulfonyl naphthalate, p-nitrobenzylsulfonyl anthrate, p-nitrobenzylsulfonyl-9',10'-anthrate, trifuluoromethane sulfonyloxy naphthalimide and trifluoromethane sulfonyloxy benzimide, The sulfonyl compound can include, for example, disulfonyldiazomethane and disulfone. The diazonaphthoquinone can include, for example, 3,4,4'-tris (diazonaphthoquinone sulfonyloxy)-2-hydroxy benzophenone and 2,3,4,4'-tetra(diazonaphthoquinone sulfonyloxy) benzophenone.

The compounds are decomposed under photo-irradiation to form an acid.

The base generator can also include those used for usual photosensitive resin compositions. Most of their basic structures are tosylamide or carbamate structures. They can include, specifically, N-cyclohexyl-p-toluenesulfonylamide, N-[1-(3,5-dimethoxyphenyl)-1-methylethoxycarbonyl] cyclohexyl amide, N-[(2,6-dinitrophenyl)methoxycarbonyl] cyclohexylamide, N-[1-(2,6-dinitrophenyl)ethoxycarbonyl] cyclohexyl amide, N-[bis(2,6-dinitrophenyl) methoxycarbonyl]cyclohexyl amide, N-[bis(2-nitrophenyl) methoxycarbonyl]octadecyl amide, N-[(2-nitrophenyl) methoxycarbonyl]octadecyl amide, N-[(2-nitrophenyl) ethoxycarbonyl]octadecyl amide, N-[1-(4,5-di-methyl-2-nitrophenyl)ethoxycarbonyl]octadecyl amide and N-[1-(4-methyl-2-nitrophenyl)ethoxycarbonyl]octadecyl amide. The compounds can be synthesized with reference to the descriptions, for example, in Journal of the American Chemical Society, 1991, vol. 113, p 4303–4313. The compounds are decomposed by photo-irradiation to form bases.

Description will be made to materials for forming the super-water-repellent surface.

There is no particular restrictions on the resin. In view of the durability, thermosetting resins such as epoxy resin and polyimide are preferred. However, polyimide tends to show low adhesion with the substrate. Glass resin (also referred to as a ladder silicon) also has a high heat resistance. It tends to show higher transparency compared with the epoxy resin and the polyimide. Further, the glass resin tends to show satisfactory dispersibility compared with other resins in a case of using silica among fine powders to be described later. The thermosetting resins such as the epoxy resin, polyimide and glass resin are suitable also in that there. is little worry after curing such as dissolution of the surface by a coating solvent when a photosensitive material is coated on the super-water-repellent surface described above.

In a case of using a polyester or styrene-acrylic resin as the resin, since there is no requirement for heat curing, it is preferred in a case of mixing a photosensitive material which is changed also by heat. The styrene-acrylic resin or poly(methacrylate)-acrylic polymer, may also be used as the form of an aqueous suspension (also referred to as a latex). By the use of them, it is possible to form a super-water-repellent surface also on the surface of an article made of resin easily dissolved by a usual organic solvent. In a case of mixing the fluoro compound with the latex, it can be mixed by previously mixing in space of monomer or spaces of monomer used upon preparing the latex and then the mixture is polymerized.

The fine powder is added for forming roughness on the super-water-repellent surface. The fine powder has no particular restriction so long as it is not dissolved in a solvent makes suspension using to the super-water-repellent surface in the present invention. For example, particles of silicon oxide (usually referred to as silica beads) and carbon particles are suitable since they are insoluble to organic solvents. In addition, metal powders used in a developing unit such as for a copying machine or a printer (usually referred to as a carrier mainly made of ferrite) used in the developer in the copying machine or the printer are also suitable since they are insoluble to the organic solvent. Toners used for the copying machine or printer mainly comprise a resin and, accordingly, they can not retain the shape of particles in a case where the solvent used upon mixing with the resin or the like is dichloromethane or acetone, since the toners are coagulated to each other or dissolved in the solvent. Therefore, roughness for forming the super-water-repellency on the surface can not be formed after evaporating the solvent, so that they are not suitable. Since the fine particles may sometimes be coagulated when added to the solvent, a kind of or kinds of dispersant is added. The dispersant dissolved in the solvent used is preferred.

The particles used have a size from several nanometers to several tens micrometers in the average grain size. There is the tendency that the surface having the small and large size of roughness shows more water-repellency than that of the similar size of roughness. Then, it seems that use of particles of different grain sizes in admixture shows well super-water-repellency. In this case, it is preferred that smaller particles have from several nanometers to several tens nanometers of the average grain size and greater particles have from several micrometers to several tens micrometers of the average grain size. Further we examine between the size of the powder and super-water-repellency, super-water-repellency on the surface was satisfactory when the average grain size of the smaller particles was within a range from $\frac{1}{50}$ to $\frac{1}{1000}$ of the average grain size of greater particles.

Fine particles of smaller grain size are coagulated more easily. Further, the particles made of material such as silicon oxide, aluminum oxide or titanium oxide tends to show better dispersibility compared with other materials (ferrite or iron powder). Therefore, in a case of using two kinds of fine particles of different average grain sizes, it is preferred that particles of the smaller grain size are made of a material comprising silicon oxide, aluminum oxide or titanium oxide.

In a case of using the glass resin for the resin, silicon oxide for the fine particles and a glass plate for the article and forming a super-water-repellent surface on the surface of the glass plate, the surface appears like that a frosted ground glass but the surface has some extent of photo-transparency. We use the thinner super-water-repellent surface, the surface shows the larger amount of ratio of photo-transparency. The photo-transparency at 400 nm is about 30% in a case where the weight ratio of resin to glass resin is at 5:1 and the film thickness is about 10 μm. In this article, the water repellency can be lowered by applying the light for lowering the water repellency not on the surface but on the rear face of the glass plate formed with the surface. However, the necessary amount of irradiation is increased by so much as the transparency is lowered.

The article is not restricted only to glass provided that it has the transparency of the photon that causes lowering the water repellency of the surface. Specifically, a rock salt plate and a quartz plate can also be mentioned in addition to glass.

The surface formed by using a glass plate as the article and using another combination for other materials (using epoxy, styrene-acryl or polyester in addition to the glass resin as the resin, and using ferrite, aluminum oxide, titanium oxide in addition to silicon oxide as the fine particles) has little photo-transparency. It is assumed that the reason why the combination of the glass resin and silicon oxide has some extent of photo-transparency may be the value of refractive index of the glass resin is nearly equal to that of the silicon oxide.

The fluoro compounds can include, for example, compounds having a perfluoroalkyl chain, compounds having a perfluoropolyether chain and compounds having a fluoro group or trifluoromethyl group on an aromatic ring. Among them, compounds having the perfluoroalkyl chain or compounds having the perfluoropolyether chain are more effective among them for improving the water high repellency. In a case of mixing with the resin or the like, it is preferred that the compound is dissolved or is miscible, although not soluble, in the solvent used since it is uniformly distributed upon film formation. In this case, those compounds having the perfluoroalkyl chain and the compounds having the perfluoropolyether chain and with large molecular weight show lower solubility to organic solvents that dissolve the resin or the like well (acetone, ethyl methyl ketone, dichloromethane, N,N-dimethyl formamide, N-methylpyrrolidone, etc). Therefore, it is desirable to bond a suitable group on the terminal for the sake of improving solubility to the organic solvent.

As the method, materials having an alkyl halide such as $CH_2I$ or $CH_2Br$ at the terminal of the perfluoroalkyl chain or the perfluoropolyether chain (the reactivity of $CH_2Br$ group is lower than $CH_2I$ group) can be improved for the solubility to the organic solvent by reacting with a material in which hydroxyl groups of linear or branched hexanol, octanol, cis- or trans-cyclohexanol or catechol derivatives, is made as ONa or OK, that is, a material transformed into an alcoholate, thereby bonding by way of the ether bond. Further, the solubility to the organic solvent can be improved by reacting with a material having an amino group at the terminal (for example, aniline, linear or branched hexylamine, octylamine or decylamine), thereby bonding by way of an amine bond. Materials having the alkyl halide at the terminal of the perfluoroalkyl chain can include, for example, 2-(perflurobutyl)ethyl iodide,
2-perfluorohexyl)ethyl iodide,
2-perfluorooctyl)ethyl iodide,
2-perfluorodecyl)ethyl iodide,
2-(perfluoro-5-methylhexyl ) ethyl iodide,
2-(perfluoro-5-methyloctyl)ethyl iodide,
2-(perfluoro-5-methyldecyl)ethyl iodide,
2,2,3,3-tetrafluoropropyl iodide, and
1H,1H,7H-dodecafluoroheptyl iodide.

Solubility to the organic solvent of the material having $CH_2OH$ at the terminal of the perfluoroalkyl chain or the perfluoropolyether chain can be improved by reacting with a material having an alkyl halide at the terminal (for example, benzyl bromide, linear or branched hexyl bromide, octyl bromide, decyl bromide), thereby bonding by way of an ether bond. Further, the solubility to the organic solvent can be improved by reacting with a material having a carboxyl group at the terminal (for example, benzoic acid, linear or branched hexanoic acid, octanoic acid and decanoic acid), thereby bonding by way of the ester bond. The materials having $CH_2OH$ at the terminal of the perfluoroalkyl chain or the perfluoropolyether chain can include, for example, 2-(perfluorohexyl)ethanol,
2-(perfluorooctyl)ethanol,
2-(perfluorodecyl)ethanol,
3-(perfluorohexyl)propanol,
3-(perfluorooctyl)propanol,
3-(perfluorodecyl)propanol,
Demnum SA manufactured by Daikin Kogyo Co.,
Fomblin Z-Dol manufactured by Ausimont Co.

The Krytox 157 FS series materials manufactured by E.I. DuPont Co. are perfluoropolyether having a carboxyl group at the terminal. The terminal can be reduced with lithium aluminum hydride and converted into the form of $CH_2OH$. Therefore, the reduced material can also be used as the material having $CH_2OH$ at the terminal.

The material having the $CO_2H$ at the terminal of the perfluoroakyl chain or the perfluoropolyether chain can be improved with the solubility to the organic solvent by reacting with a material having an amino group at the terminal (for example, aniline, linear or branched hexylamine, octylamine and decylamine), thereby bonding by way of a amide bond. Further, the solubility to the organic solvent can be improved by reacting with a material having a hydroxyl group at the terminal (for example, linear or branched hexanol, octanol, cis or trans cyclohexanol or catechol derivative), thereby bonding by way of an ester bond. The materials having $CO_2H$ at the terminal of the perfluoroalkyl chain or the perfluoropolyether chain can include, for example, perfluorohexanoic acid,
perfluorooctanoic acid,
perfluorodecanoic acid,
7H-dodecafluoroheptanoic acid,
9H-hexadecafluorononaoic acid,
perfluoroazelaic acid,
Demnum SH manufactured by Daikin Kogyo Co.,
Fomblin Z-DIAC manufactured by Ausimont Co. and
Krytox 157FS-L, 157FS-M, 157FS-H manufactured by E.I. Dupont.

The material having the epoxy group at the terminal of the perfluoroalkyl chain or the perfluoropolyether chain can be improved with the solubility to the organic solvent by reacting with a material having an amino group at the terminal and a material having a hydroxyl group at the terminal, thereby bonding by way of various bonds. The material having the epoxy group at the terminal of the perfluoroalkyl chain or the perfluoropolyether chain can include, for example, 3-perfluorohexyl-1,2-epoxy propane,
3-perfluorooctyl-1,2-epoxy propane,
3-perfluorodecyl-1,2-epoxy propane,
3-(perfluoro-5-methylhexyl)-1,2-epoxy propane,
3- (perfluoro-5-methyloctyl)-1,2-epoxy propane,
3-(perfluoro-5-methyldecyl)-1,2-epoxy propane,
3-(1H,1H,7H-dodecafluoroheptyloxy)-1,2-epoxy propane, and
3-(1H,2H,9H-hexadecafluorononyloxy)-1,2-epoxy propane.

The materials having $CH=CH_2$ group at the terminal of the perfluoroalkyl chain or the perfluoropolyether chain can be improved with the solubility to the organic solvent by polymerizing with a material having $CH_2=CH$ group such as styrene or alkylmethacrylate. However, since there are two or more reaction sites per one molecule, if they are polymerized in excess, the molecular weight is increased to possibly lower the solubility. The material having the $CH=CH_2$ group at the terminal of the perfluoroalkyl chain can include, for example, (perfluorohexyl)ethylene,
(perfluorooctyl)ethylene,
(perfluorodecyl)ethylene,
1,6-divinyldodecafluorohexane, and
1,8-divinylhexadecafluorooctane.

Among the fluoro compounds described above, those having good solubility with the monomer of the epoxy resin and easily forming the super-water-repellent surface can include the following compounds. In the compounds, preferred average molecular weight in the perfluoroalkyl chain is from 1500 to 5000 for the compounds, 1–8, from 2,000 to 9000 for the compounds 9, 10 and from 2000 to 5000 for the compound 11 since the solubility with the monomer is satisfactory.

Regarding the perfluoroether chains of the compounds, those having the repeating unit of $—CF(CF_3)—CF_2—O—$ use Kryotox 157 FS-L, FS-M or FS-H manufactured by E.I. DuPont Co. as the material, those having monomer units of $—CF_2—CF_2—CF_2—O—$ use Demnum SH manufactured by Daikin Kogyo as the material and those having the repeating unit of $\{CF_2—CF_2—O—)x—(CF_2—O—)_y\}—$ use Z-DIAC manufactured by Ausimont Co. as the material.

Compound 1
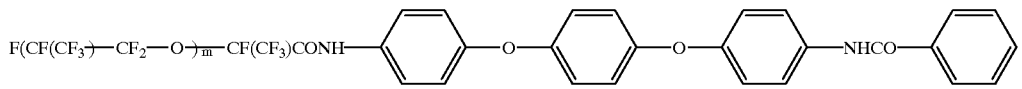
Compound 2
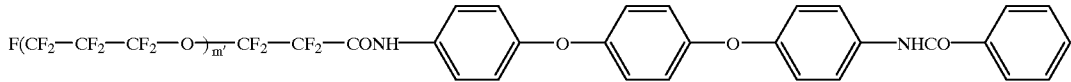
Compound 3
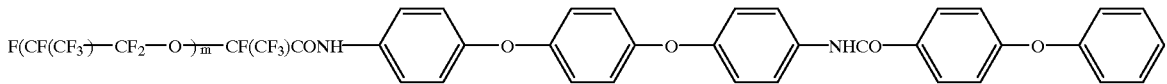
Compound 4
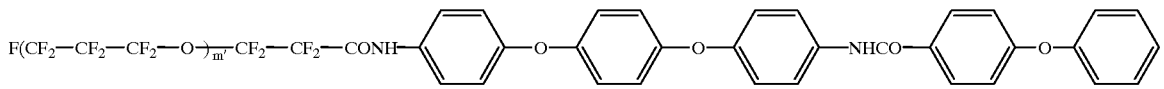
Compound 5
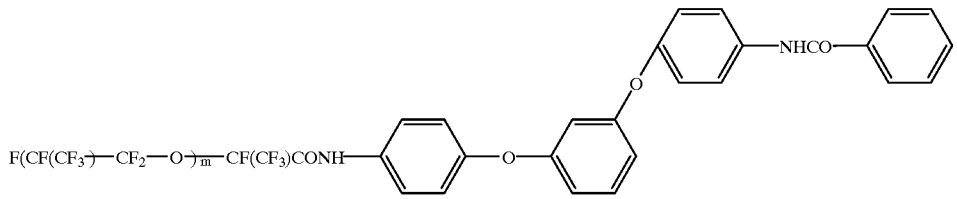
Compound 6
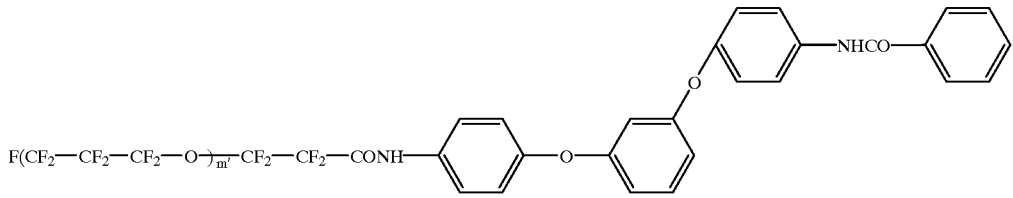

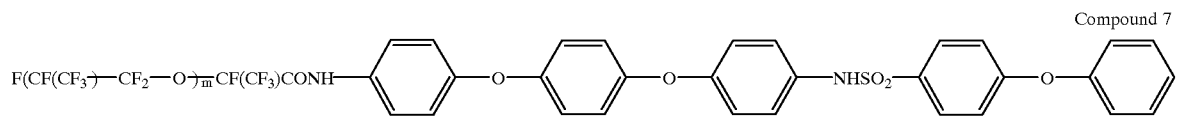

Compound 7

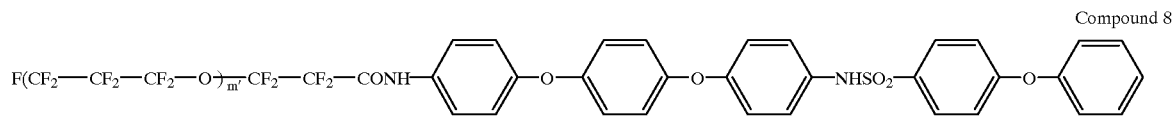

Compound 8

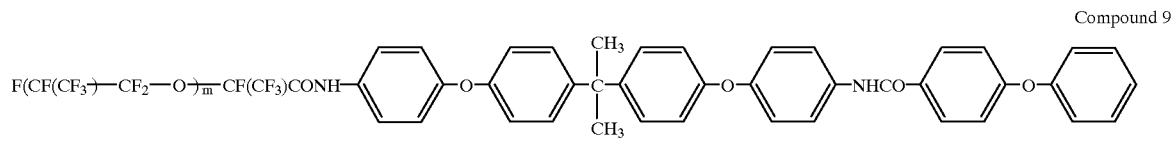

Compound 9

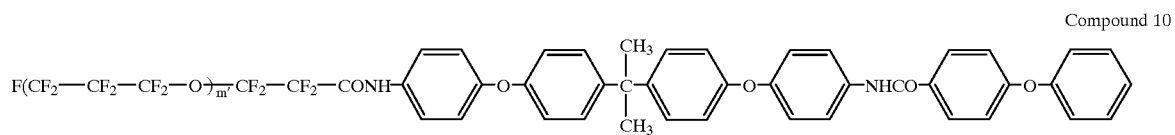

Compound 10

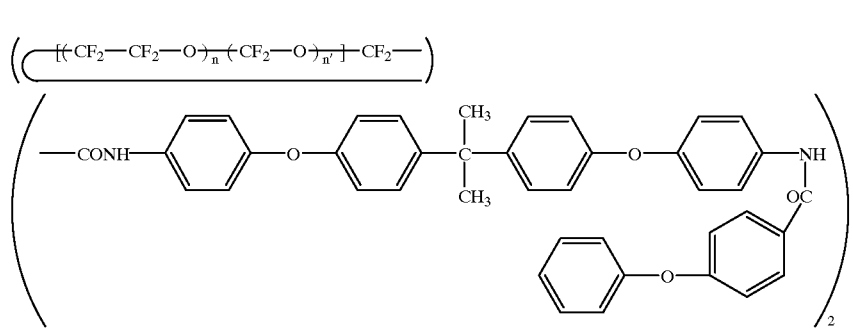

Compound 11

Synthesis for the fluoro compounds described above is as shown below.

(Synthesis of Compound 1)

Krytox 157 FS-L manufactured by E.I. DuPont Co. (average molecular weight 2500)(25 parts by weight) was dissolved in FC-72 manufactured by 3M Co. (300 parts by weight), to which thionyl chloride (2 parts by weight) and dichloromethane (20 parts by weight) were added and refluxed under stirring for 48 hours. Thionyl chloride and FC-72 as the solvent were evaporated by an evaporator to obtain an acid chloride of Krytox 157 FS-L (20 parts by weight).

1,4-bis(4-aminophenoxy)benzene (29 parts by weight) manufactured by Mitsui Toatsu Co. and triethylamine (25 parts by weight) were dissolved in dichloromethane (100 parts by weight), to which benzoyl chloride (14 parts by weight) dissolved in dichloromethane (100 parts by weight) were dropped under stirring for 2 hours and then continuously stirred for 20 hours. The reaction solution was filtered by filter paper and the filtrate was concentrated by an evaporator and then separated and purified by a silica gel column chromatography (using Wakogel C-200 manufactured by Wako Junyaku Co.) to obtain the compound 12 having a benzene ring on one side of the amino group (20 parts by weight).

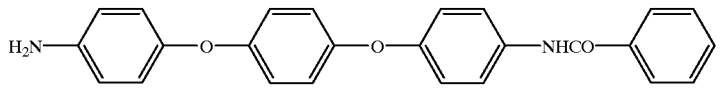

An acid chloride of Krytox 157 FS-L (25 parts by weight), the compound 12 (4 parts by weight), triethylamine (2 parts by weight) and dichloromethane (20 parts by weight) were added to FC-72 (100 parts by weight) and refluxed under stirring for 48 hours. The reaction solution was filtered by filter paper and filtrate was stood still for 12 hours. The dichloromethane layer in the upper layer was removed, chloromethane (20 parts by weight) was added further, stirred for one hour and then stood still for 12 hours. The dichloromethane layer in the upper layer was removed, and FC-72 in the FC-72 layer of the lower layer was evaporated by an evaporator and a vacuum pump to obtain compound 1 (25 parts bay weight).

(Synthesis of Compound 2)

The compound 2 (35 parts by weight) was obtained in the same manner as the synthesis of the compound 1 except for using Demnum SH (average molecular weight 3500) (35 parts by weight) manufactured by Daikin Kogyo Co. instead of Krytox 157 FS-L (average molecular weight 2500) (25 parts by weight) manufactured by E.I. DuPont Co.

(Synthesis of Compound 3)

The compound 13 (25 parts by weight) was obtained in the same manner as the synthesis of the compound 12 except for using p-phenoxybenzyl chloride (23 parts by weight) instead of benzoyl chloride (14 parts by weight)

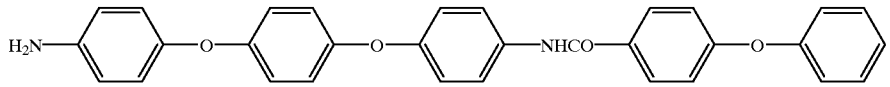

Then, the compound 3 (25 parts by weight) was obtained in the same manner as the synthesis for the compound 1 except for using the compound 13 (5 parts by weight) instead of the compound 12 (4 parts by weight).

(Synthesis of Compound 4)

The compound 4 (35 parts by weight) was obtained in the same manner as the synthesis for the compound 3 except for using Demnum SH (average molecular weight 3500) (35 parts by weight) manufactured by Daikin Kogyo Co. instead of Krytox 157 FS-L (average molecular weight 2500) (25 parts by weight manufactured by E.I. DuPont Co.

(Synthesis of Compound 5)

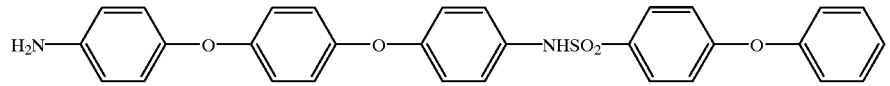

The compound 14 (20 parts by weight) was obtained in the same manner as the synthesis for the compound 12 except for using 1,3-bis(4-aminophenoxy)benzene (29 parts by weight) manufactured by Mitsui Toatsu Co. instead of 1,4-bis(4-aminophenoxy)benzene (29 parts by weight).

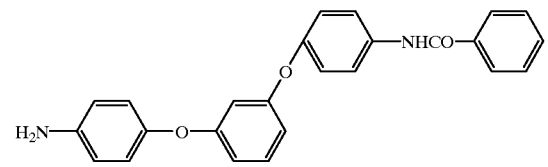

The compound 5 (25 parts by weight) was obtained in the same manner as the synthesis for the compound 1 except for using the compound 14 (4 parts by weight instead of the compound 12 (4 parts by weight).

(Synthesis of Compound 6)

The compound 6 (35 parts by weight) was obtained in the same manner as the synthesis for the compound 5 except for using Demnum SH (average molecular weight 3500) (35 parts by weight) manufactured by Daikin Kogyo Co. instead of Krytox 157 FS-L (average molecular weight (2500) (25 parts by weight) manufactured by E.I. DuPont Co.

(Synthesis of Compound 7)

The compound 15 (21 parts by weight) was obtained in the same manner as the synthesis for the compound 12 except for using benzene sulfonyl chloride (18 parts by weight) instead of benzoyl chloride (14 parts by weight).

Then, the compound 7 (25 parts by weight) was obtained in the same manner as the synthesis for the compound 1 except for using the compound 15 (5 parts by weight) instead of the compound 12 (4 parts by weight).

(Synthesis of Compound 8)

The compound 8 (35 parts by weight) was obtained in the same manner as the synthesis for the compound 7 except for using Demnum SH (average molecular weight 3500) (35 parts by weight) manufactured by Daikin Kogyo Co. instead of Krytox 157 FS-L (average molecular weight 2500) (25 parts by weight) manufactured by E.I. Dupont Co.
(Synthesis of Compound 9)

The compound 16 (30 parts by weight) was obtained in the same manner as the synthesis of the compound 12 except for using 2,2-bis[4-aminophenoxy)phenyl]propane (41 parts by weight) manufactured by Mitsui Toatsu Co. instead of 1,4-bis(4-aminophenoxy)benzene (29 parts by weight).

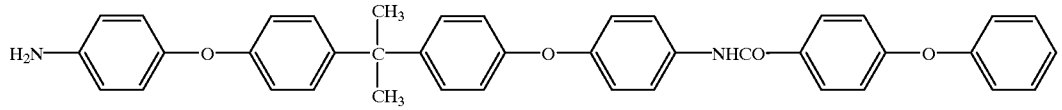

Then, the compound 9 (25 parts by weight) was obtained in the same manner as the synthesis for the compound 1 except for using the compound 14 (7 parts by weight) instead of the compound 12 (4 parts by weight).
(Synthesis of Compound 10)

A compound 10 (35 parts by weight) was obtained in the same manner as the synthesis for the compound 9 except for using Demnum SH (average molecular weight 3500) (35 parts by weight) manufactured by Daikin Kogyo Co. instead of Krytox 157 FS-L (average molecular weight 2500) (25 parts by weight) manufactured by E.I. DuPont Co.
(Synthesis of Compound 11)

Z-DIAC manufactured by Ausimont Co. (average molecular weight 4000) (40 parts by weight) was dissolved in FC-72 (200 parts by weight), to which dicylohexyl carbodiimide (5 parts by weight), compound 16 (13 parts by weight) and dichloromethane (100 parts by weight) were added and stirred for 120 hours. After filtering the reaction solution by filter paper, the filtrate was stood still for 12 hours. The dichloromethane layer in the upper layer was removed, dichloromethane (20 parts by weight) was added further, stirred for one hour and stood still for 12 hours. The dichloromethane layer in the upper layer was removed and FC-72 in the FC-72 layer of the lower layer was evaporated by an evaporator and a vacuum pump, to obtain compound 11 (40 parts by weight).

In a case of using the compounds 1–11 or analogous materials, since they are photosensitive materials per se the structures of which are changed by a light at a wavelength of about 250 nm, they can be the article of the present invention with no use of a photosensitive material depending on the wavelength of light irradiated. In the material, amide couplings, etc. are disconnected by the photo-irradiation at a wavelength of about 250 nm to form hydrophilic groups such as carboxyl groups. When this reaction is taken place near the super-water-repellent surface, since carboxyl groups and the like are formed at or near the surface, the hydrophilicity at the periphery thereof is increased compared with the before disconnection. It is considered that the surface water repellency is lowered by this processing.

In a case of coating a fluoro compound after forming rough surface, it is convenient for handling to use a compound soluble to a solvent to be coated. Further, the fluoro compound which is fixed upon coating to the surface can easily maintain the super-water-repellency for a long time. In this case, compounds having $SiR_3$ (R: $CH_3$, $C_2H_5$, $OCH_3$ or $OC_2H_5$) at the terminal of the perfluoroalkyl chain or the perfluoropolyether chain are preferred since they are chemically bonded with the surface by heating after coating. Such materials can be obtained, for example, by condensation of Saira Ace manufactured by Chisso Co. ($SiR_3$ on one terminal and amino group or epoxy group on the other terminal) and a material having a hydroxy group or amino group on the terminal of the perfluoroalkyl chain or the perfluoropolyether chain.

3. Application Uses of the Article of the Present Invention

The article of the present invention may be applied to the improvement of the high quality in printing using aqueous ink or fine fabrication technique of photoresist. For example, when photo-irradiation partially to a super-water-repellent surface thereby lowering the water repellency, a difference of the water-repellency is caused for the difference of the adhesion character of the aqueous ink between the photo-irradiated part and the super-water-repellent part. That is, latent images due to the difference of the water repellency are formed. Then, a printing machine using the material as a photoreceptor can be constituted. Further, when an aqueous material to engrave the super-water-repellent surface by etching or dissolving the surface is deposited to the latent images, the relevant part is concaved compared with other parts. By using the above surface as an original plate, intaglio or letter press printing is possible. By controlling the super-water-repellency by photo-irradiation as described above, it is considered that development for novel printing technology described above is possible.

In addition, it is considered that pattern formation by a water soluble resist or partial coating is possible also by utilizing the method of forming the article of the present invention, that is, by distinctly dividing the super-water-repellent part and other part by photo-irradiation.

The present invention will be explained by way of examples.

EXAMPLE 1

A method of preparing a paint for forming a super-water-repellent surface is at first described. EP1004 manufactured by YUKA SHELL EPOXY KABUSHIKI KAISHA (44 parts) as the epoxy resin, Maruka Lyncur M manufactured by Maruzen Petrochemical Co. (30 parts by weight) as the phenol resin, and triethylamine tetraphenyl borate manufactured by Hokko Kagaku K.K. (trade name: TEA-K) (1 part by weight) as the catalyzer were dissolved in a mixed solvent of ethyl methyl ketone (950 parts by weight), ethylene glycol mono-n-butyl ether acetate (50 parts by weight), and the compound 1 (2 parts by weight) as the fluoro compound were mixed and stirred thoroughly. Then, Aerosil 130 manufactured by Nihon Aerosil Co. Ltd. (average grain size: about 16 nm) (8 parts by weight) and Nipsil E-220A manufactured by Nippon Silica Industrial Co. Ltd. (average grain size: about 1.5 μm) (8 parts by weight) were added and stirred thoroughly. A paint for forming a super-water-repellent surface was thus prepared. Aerosil 130 has a grain size of about 1/94 of Nipsil E-220A.

After dipping a glass plate of 3 cm length, 2 cm width and about 1 mm thickness for 10 sec in the paint, the plate was pulled up at a rate of 3 cm/sec from the paint. When the glass plate was heated at 120° C. for 30 min and, successively, at 200° C. for 45 min, a glass plate having a surface with an contact angle with water of 150° or more, namely, having a super-water-repellent surface was fabricated.

Then, a photosensitive material was coated on the surface of the glass plate. Bis[4-(dimethylamino)phenyl] phenyl-methane which is a kind of the malachite green derivatives as photochromic compound (hereinafter referred to as compound 12) (2 parts by weight) was is dissolved in dichloromethane (98 parts by weight).

Compound 12

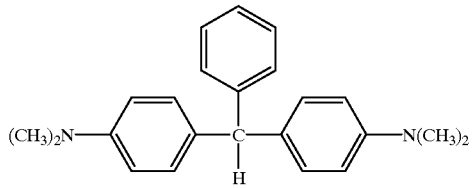

2 wt % solution of the compound 12 in dichloromethane was thus prepared. After dipping the glass plate as described above in the solution for 10 sec, the plate was pulled up at a rate 3 cm/sec from the dichloromethane solution. The glass plate was dried at 40° C. for 30 min. The compound 12 was thus coated on the super-water-repellent surface. The surface showed super-water-repellency also after coating the material, and a water droplet dropped to the surface tumbled down along the surface like a glass bead.

Photo-irradiation was performed for 2 min to the surface by using a 500 W xenon lamp manufactured by Ushio Electric Inc. by way of a colored glass filter UV-D36B manufactured by Toshiba Glass Co. The photo-intensity was 6.6 mW/cm$^2$. Then, the contact angle with water on the surface was lowered to 90°. UV-D36B has a photo-transparent range of the light at a wavelength of 300 to 400 nm.

After dipping the glass plate having the water repellency on the surface lowered by photo-irradiation in an aqueous solution of sodium hydroxide at pH 13 for 10 sec, the aqueous solution of sodium hydroxide adhered on the surface was washed out with water. Subsequently, the glass plate was heated at 120° C. for 2 hours. After cooling the glass plate to room temperature, when a water droplet was dropped on the surface, the surface showed super-water-repellency.

EXAMPLE 2

After drying the glass plate coated with the coating solution for forming the super-water-repellent surface fabricated in example 1 at 120° C. for 30 min and, successively, at 180° C. for 30 min, photo-irradiation was performed for 2 min by a 500 W xenon lamp manufactured by Ushio Electric Inc. by way of a colored glass filter UV-D33S manufactured by Toshiba Glass Co. without a step of coating the compound 12. The photo-intensity was 64 mW/cm$^2$. Then, the contact angle with water on the surface showing the super-water-repellency before photo-irradiation was lowered to 90°. UV-D33S has a photo-transparent range of the light at a wavelength of 230 to 430 nm.

When heating was applied at 200° C. for 45 min instead of at 180° C. for 30 min, the contact angle is not lowered even after the photo-irradiation but the super-water-repellency was left as it was.

EXAMPLE 3

When photo-irradiation was performed in the same manner as in example 1 except for reducing the concentration of the solution of the compound 12 to 0.5 wt %, the contact angle with water on the surface showing the super-water-repellency before the photo-irradiation was lowered to 85°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 4

When photo-irradiation was performed in the same manner as in example 1 except for reducing the concentration of the solution of the compound 12 to 0.2 wt %, the contact angle with water on the surface showing the super-water-repellency before the photo-irradiation was lowered to 105°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 5

A glass plate with a super-water-repellent surface was fabricated in the same manner as in example 1 except for using Aerosil MOX 80 manufactured by Nihon Aerosil Co. (average grain size: about 30 nm) (8 parts by weight) instead of Aerosil 130 (average grain size: about 16 nm) (8 parts by weight). When 2 wt % solution of the compound 12 in dichloromethane was coated and dried in the same manner as in example 1, the surface showed the super-water-repellency. The Aerosil MOX 80 has a grain size of about 1/50 of Nipsil E-220A.

When photo-irradiation was performed in the same manner as in example 1, the contact angle with water on the surface showing super-water-repellency before the photo-irradiation was lowered to 85°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

Comparative Example 1

A glass plate with a super-water-repellent surface was fabricated in the same manner as in example 1 except for using Aerosil OX 50 manufactured by Nihon Aerosil Co. (average grain size; about 40 nm) (8 parts by weight) instead of Aerosil MOX-80 (average grain size: about 30 nm) (8 parts by weight). When 2 wt % of a solution of the compound 12 in dichloromethane was coated and dried in the same manner as in example 1, the surface did not show super-water-repellency. The surface coated with 0.5 wt % or 0.2 wt % solution and dried showed the super-water-repellency. The Aerosil OX 50 has a grain size of about 1/38 of Nipsil E-220A.

Then, when photo-irradiation was performed to the surface coated with 0.5 wt % or 0.2 wt % solution of the compound 12 in the same manner as in example 1, the contact angle with water on the surface showing the super-water-repellency before the photo-irradiation was lowered to 85° (surface coated with 0.5 wt % of compound 12) or to 100° (surface coated with 0.2 wt % of compound 12).

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 6

A glass plate with a super-water-repellent surface was fabricated in the same manner as in example 1 except for using Wakosil 7SIL-120 manufactured by Wako Junyaku Co. (average grain size: about 7 μm) (8 parts by weight) instead of Nipsil E-220A (average grain size: about 1.5 μm) (8 parts by weight), and using Aerosil R812 (average grain size: about 7 nm) (8 parts by weight) manufactured by Nihon Aerosil instead of Aerosil 130 (average grain size: about : 16 nm) (8 parts by weight). When 2 wt % solution of the compound 12 in dichloromethane was coated and dried in the same manner as in example 1, the surface showed the super-water-repellency. The Aerosil R812 has a grain size of about 1/1000 of Wakosil 7SIL-120.

When photo-irradiation was performed in the same manner as in example 1, the contact angle with water on the surface showing the super-water-repellency before the photo-irradiation was lowered to 85°.

When the glass plate the water repellency on the surface of which was lowered by the photo-irradiation was dipped in an aqueous solution of sodium hydroxide, washed substantially, heated and cooled, and then a water droplet was dropped on the surface in the same manner as in example 1, the surface showed the super-water-repellency.

Comparative Example 2

A glass plate with a super-water-repellent surface was fabricated in the same manner as in example 1 except for using Wakosil 10SIL-120 manufactured by Wako Junyaku Co. (average grain size: about 10 μm) (8 parts by weight) instead of Wakosil 7SIL-120 (average grain size: about 7 μm) (8 parts by weight). When 2 wt % solution of the compound 12 in dichloromethane was coated and dried in the same manner as in example 1, the surface showed no super-water-repellency. However, the surface coated with 0.5 wt % or 0.2 wt % solution and dried showed the super-water-repellency. The Aerosil R812 has a grain size of about 1/1400 of Wakosil 10SIL-120.

Then, when photo-irradiation was performed to the surface coated with 0.5 wt % or 0.2 wt % solution of the compound 12 in the same manner as in example 1, the contact angle with water on the surface showing the super-water-repellency before the photo-irradiation was lowered to 85° (surface coated with 0.5 wt % compound 12) or 100° (surface coated with 0.2 wt % compound 12).

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 7

When photo-irradiation was performed in the same manner as in example 1 except for using 0.5 wt % solution of bis-[4-(dibutylamino)phenyl]phenylmethanol (hereinafter referred to as compound 13) (solvent: dichloromethane) instead of the compound 12, the contact angle with water on the surface showing the super-water-repellency before the photo-irradiation was lowered to 80°.

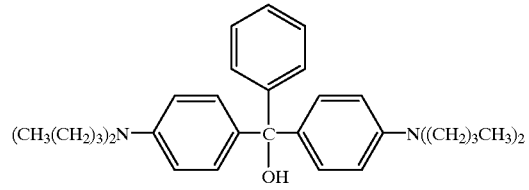

Compound 13

Synthesis for bis-[(dibutylamino)phenyl] phenylmethanol was conducted by the method as described in Bulletin of the Chemical Society of Japan 1988, Vol. 61, p 2321.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 8

When photo-irradiation was performed in the same manner as in example 1 except for using 0.5 wt % solution of 1-n-octadecyl-3,3-dimethylindolino-6'-nitrobenzospiran (hereinafter referred to as compound 14) (solvent: dichloromethane) instead of the compound 12, the contact angle with water on the surface showing the super-water-repellency before the photo-irradiation was lowered to 110°.

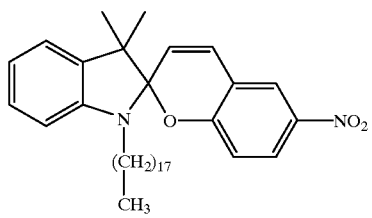

Compound 14

Synthesis for 1-n-octadecyl-3,3-dimethylindolino-6'-nitrobenzospiran was conducted by the method as described in Chemistry Letters, 1990, p 555.

EXAMPLE 9

When photo-irradiation was performed in the same manner as in example 1 except for using 0.5 wt % solution of 2,3-diphenyl-1-indenone oxide (hereinafter referred to as compound 15) (solvent: dichloromethane) instead of the compound 12, the contact angle with water on the surface showing the super-water-repellency before the photo-irradiation was lowered to 130°.

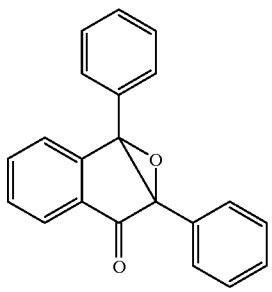

Compound 15

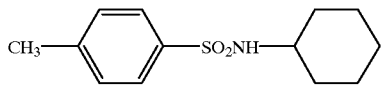

Compound 18

Synthesis for 2,3-diphenyl-1-indenone oxide was conducted by the method as described in Journal of the Chemical Education, 1971, vol. 48, p 554.

EXAMPLE 10

When photo-irradiation was performed in the same manner as in example 1 except for using 2 wt % solution of trifluoromethane sulfonyl oxybenzimide (hereinafter referred to as a compound 16) (solvent: dichloromethane) instead of the compound 12, the contact angle with water on the surface showing the super-water-repellency before the photo-irradiation was lowered to 100°.

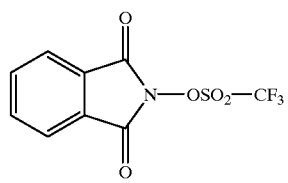

Compound 16

EXAMPLE 11

When photo-irradiation was performed in the same manner as in example 10 except for using 2 wt % solution of tris(benzenesulfonyloxy)benzene (hereinafter referred to as a compound 17) (solvent: dichioromethane) instead of the compound 16 the contact angle with water on the surface showing the super-water-repellency before the photo-irradiation was lowered to 100°.

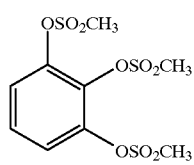

Compound 17

EXAMPLE 12

When photo-irradiation was performed in the same manner as in example 10 except for using 2 wt % solution of N-cyclohexyl-p-toluene sulfonyl amide (hereinafter referred to as a compound 18) (solvent: dichloromethane) instead of the compound 16, the contact angle with water on the surface showing the super-water-repellency before the photo-irradiation was lowered to 130°.

EXAMPLE 13

Glass resin GR650 manufactured by Showa Denko Co. (50 parts by weight) was dissolved in a mixed solvent of ethyl methyl ketone (950 parts by weight) and ethylene glycol mono-n-butyl ether acetate (50 parts by weight), to which the compound 1 (2 parts by weight) as the fluoro compound was added and stirred or thoroughly. Then, Aerosil 130 manufactured by Nihon Aerosil Co. Ltd. (average grain size: about 16 nm) (8 parts by weight) and Nipsil E-220A manufactured by Nippon Silica Industrial Co. Ltd. (average gain size: about 1.5 μm) (8 parts by weight) were added and stirred thoroughly. A paint for forming a super-water-repellent surface was thus prepared. When the paint was coated on the glass plate and then heated in the same manner as in example 1, a super-water-repellent surface was formed on the glass plate.

The surface was coated with 2 wt % solution bis[4-dimethylamino)pheny]phenylmethane (solvent: dichloromethane) in the same manner as in example 1 and dried. When photo-irradiation was performed in the same manner as in example 1, the contact angle with water on the surface was lowered to 90°. Aerosil 130 has a grain size of about 1/94 of Nipsil E-220A.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 14

Styrene-acryl resin: Perfector 9155 manufactured by Hitachi Kasei Kogyo Co. (50 parts by weight) was dissolved in a mixed solvent of ethyl methyl ketone (950 parts by weight) and ethylene glycol mono-n-butyl ether acetate (50 parts by weight), to which the compound 1 (2 parts by weight) as the fluoro compound was added and stirred thoroughly. Then, Aerosil 130 manufactured by Nihon Aerosil Co. Ltd. (average grain size: about 16 nm) (8 parts by weight) and Nipsil E-220A manufactured by Nippon Silica Industrial Co. Ltd. (average grain size: about 1.5 μm) (8 parts by weight) were added and stirred thoroughly. A paint for forming a super-water-repellent surface was thus prepared. A super-water-repellent surface was formed by coating the material on the glass plate and heated at 100° C. for 30 min in the same manner as in example 1. Aerosil 130 has a grain size of about 1/94 of Nipsil E-220A.

The surface was coated with 2 wt % solution of compound 12 (solvent: ethanol) and dried in the same manner as in example 1. When photo-irradiation was performed in the same manner as in example 1, the contact angle with water on the surface was lowered to 90°.

EXAMPLE 15

When the super-water-repellent surface was formed in the same manner as in example 1 except for replacing the compound 1 with the compound 2 (2 parts by weight) the compound 12 was coated thereover in the same manner as in example 1 and, further, the photo-irradiation was performed, the contact angle with water on the surface showing the super-water-repellency before the photo-irradiation was lowered to 90°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 16

When the super-water-repellent surface was formed in the same manner as in example 1 except for replacing the compound 1 with the compound 3 (2 parts by weight), the compound 12 was coated thereover in the same manner as in example 1 and, further, the photo-irradiation was performed, the contact angle with water on the surface showing the super-water-repellency before the photo-irradiation was lowered to 90°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 17

When the super-water-repellent surface was formed in the same manner as in example 1 except for replacing the compound 1 with the compound 5 (2 parts by weight), the compound 12 was coated thereover in the same manner as in example 1 and, further, the photo-irradiation was performed, the contact angle with water on the surface showing the super-water-repellency before the photo-irradiation was lowered to 90°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 18

When the super-water-repellent surface was formed in the same manner as in example 1 except for replacing the compound 1 with the compound 7 (2 parts by weight), the compound 12 was coated thereover in the same manner as in example 1 and, further, the photo-irradiation was performed, the contact angle with water on the surface showing the super-water-repellency before the photo-irradiation was lowered to 90°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 19

When the super-water-repellent surface was formed in the same manner as in example 1 except for replacing the compound 1 with the compound 9 (2 parts by weight), the compound 12 was coated thereover in the same manner as in example 1 and, further, the photo-irradiation was performed, the contact angle with water on the surface showing the super-water-repellency before the photo-irradiation was lowered to 90°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 20

When the super-water-repellent surface was formed in the same manner as in example 1 except for replacing the compound 1 with the compound 11 (2 parts by weight), the compound 12 was coated thereover in the same manner as in example 1 and, further, the photo-irradiation was performed, the contact angle with water on the surface showing the super-water-repellency before the photo-irradiation was lowered to 90°.

When the glass plate the water repellency on the surface of which was lowered by the photo-irradiation was dipped in an aqueous solution of sodium hydroxide, washed subsequently, heated and cooled, and then a water droplet was dropped on the surface in the same manner as in example 1, the surface showed the super-water-repellency.

EXAMPLE 21

A paint for forming a super-water-repellent surface used in example 14 was prepared in the same manner except for using a high molecular polymer having an azobenzene group of the following structure (hereinafter referred to as the compound 19) (50 parts by weight) instead of Perfector 9155 (50 parts by weight).

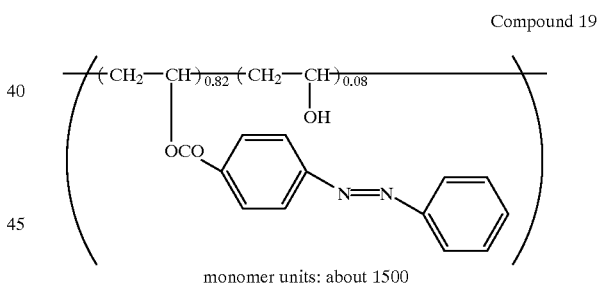

Compound 19 monomer units: about 1500

After coating the paint on a glass plate and then heating at 100° C. for 30 min in the same manner as in example 1, a super-water-repellent surface was formed. When photo-irradiation was performed in the same manner as in example 1 except for changing the irradiation time from 2 min to 10 min, the contact angle with water on the surface was lowered to 120°.

Then, after photo-irradiation in the same manner except for using the glass filter with Y-45 manufactured by Toshiba Glass Co., the article was dried at 120° C. for 2 hours. Then the surface the contact angle with water of which was lowered to 120° was returned to the surface showing the super-water-repellency of 150° or more. Y-45 has a photo-transparent range of the light at a wavelength of 430 nm or more.

The surface at which the contact angle with water was lowered to 120° could be returned to the surface having the super-water-repellency of 150° or more in the same manner as described above by changing the heating time from 120° C. to 100° C. and the heating time from 2 hours to 6 hours.

Further, the surface on which the contact angle with water was lowered to 120° could be returned to the surface showing the super-water-repellency of 150° or more by changing the heating temperature from 120° C. to 150° C. and the heating time from 2 hours to 3 hours, without photo-irradiation using Y-45.

The method for synthesizing the compound 19 is as described below.

Polyvinyl alcohol (monomer units: about 1500) (44 parts by weight) was dissolved in water (3000 parts by weight) under heating, dissolved completely and then cooled to a room temperature. Sodium hydroxide (160 parts by weight) dissolved in water (2000 parts by weight) was added. The solution is referred to as solution A. 4-phenylazobenzoyl chloride (270 parts by weight) was dissolved in ethyl methyl ketone (5000 parts by weight). The solution is referred to as a solution B. After cooling both of the solutions A and B to −2° C., they were mixed and stirred rapidly and violently. During stirring, the temperature of the mixture was controlled between −5 and 0° C. After stirring for 5 hours, the mixture was stood still. The aqueous solution layer in the lower layer was removed, and the upper layer and deposited solids were washed thoroughly with an aqueous 5% solution of sodium chloride till the washing liquid became neutral. Methanol (5000 parts by weight) was added to deposit the solids sufficiently and, after filtration, the solids were dried under a reduced pressure. The solids were dissolved in tetrahydrofuran (hereinafter simply referred to as THF) in an amount as less as possible, the solution was filtered by filter paper and the filtrate was placed in a dialytic tube. After tightly closing the tube ends so as not to cause leakage, the tube was dipped in ten times volume of THF for 2 days. After pulling up the dialysis tube and taking out the solution therein, it was dropped in methanol 100 times by weight of the solution. During dropping, methanol was stirred thoroughly. The deposited solids were collected by filtration and dried well to obtain compound 19 (120 parts by weight). As a result of elemental analysis, it was found that azobenzene was coupled to 92% of hydroxyl groups of polyvinyl alcohol.

EXAMPLE 22

Description will be made to an example of coating a photosensitive material and then coating the fluoro compound and applying photo-irradiation.

A method of synthesizing the fluoro compound (compound 20) to be used is at first described.

Compound 20

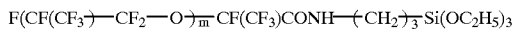

Krytox 157 FS-L manufactured by E. I. DuPont Co. (average molecular weight 2500) (25 parts by weight) was dissolved in FC-72 (100 parts by weight), to which thionyl-chloride (2 parts by weight and dichloromethane (20 parts by weight) were added and refluxed for 48 hours under stirring. Thionylchloride and FC-72 in the reaction solution were evaporated by an evaporator. The residue was dissolved again in FC-72 (100 parts by weight), to which Saira Ace S330 manufactured by Chisso Co. (structure: 3-aminopropyl triethoxy silane) (3 parts by weight) and dichloromethane (20 parts by weight) were added, stirred for 12 hours and then stood still for 12 hours. The dichloromethane layer in the upper layer was removed, and FC-72 was evaporated at a room temperature by using an evaporator and a vacuum pump, to obtain compound 20.

A paint was prepared in the same method for preparing the paint for forming the super-water-repellent surface of example 1 except for not adding the compound 1 after coating the material on the glass plate and heating in the same manner as in example 1, the compound 12 was coated and dried. Then, after dipping the same in 0.1 wt % solution of the compound 20 in FC-72 for 10 sec, it was pulled up at a rate 3 cm/sec from the paint. Then, the plate was heated at 120° C. for 20 min. The super-water-repellent surface was thus obtained. When photo-irradiation performed to the plate in the same manner as in example 1, the contact angle with water on the surface showing the super-water-repellency was lowered to 120°.

EXAMPLE 23

The super-water-repellent surface was obtained by the same method as in example 22 except for using the compound 21 instead of the compound 20 and, when photo-irradiation was performed in the same manner as in example 1, the contact angle with water on the surface showing the super-water-repellency was lowered to 120°.

Compound 21

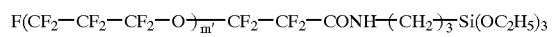

The compound 21 was synthesized by the same method as that for the compound 20 described in example 22 except for using Demnum SH manufactured by Daikin Kogyo Co. (average molecular weight 3500) (35 parts by weight) instead of Krytox 157 FS-L manufactured by E.I. DuPont Co. (average molecular weight 2500) (25 parts by weight).

EXAMPLE 24

Description is to be made to an example of forming a super-water-repellent surface by using the fluoro compound having a photosensitive site and photo-irradiating to the surface.

Description is to be made at first for the method of synthesizing the fluoro compound having the photosensitive site (compound 22).

Compound 22

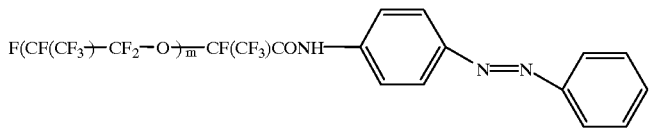

Krytox 157 FS-L manufactured by E. I. DuPont Co. (average molecular weight 2500) (25 parts by weight) was dissolved in FC-72 (100 parts by weight), to which thionylchloride (2 parts by weight and dichloro methane (20 parts by weight) were added and refluxed for 48 hours under stirring. Thionylchloride and FC-72 in the mixture were evaporated by an evaporator. The residue was dissolved again in FC-72 (100 parts by weight), to which p-aminoazobenzene (3 parts by weight), dichloromethane (50 parts by weight) and pyridine (1 part by weight) were added, stirred for 48 hours and then stood still for 12 hours. The dichloromethane layer in the upper layer was removed, FC-72 was filtered by filter paper and then FC-72 was evaporated at a room temperature by using an evaporator and a vacuum pump, to obtain compound 22.

Then, a method of preparing a paint for forming a super-water-repellent surface is as follows.

EP 1004 manufactured by YUKA SHELL EPOXY KABUSHIKI KAISHA (44 parts by weight) as the epoxy resin, Maruka Lyncur-M manufactured by Maruzen Petrochemical Co. (30 parts by weight) as the phenol resin, triethylamine tetraphenyl borate manufactured by Hokko Kagaku K.K. (trade name: TEA-K) (1 part by weight) as the catalyzer were dissolved in a mixed solvent of ethyl methyl ketone (950 parts by weight) and ethylene glycol mono-n-butyl ether acetate (50 parts by weight), compound 22 (3 parts by weight) as the fluoro compound and Homogenol L-95 manufactured by Kao Corp. as the surfactant were mixed and stirred thoroughly. Then, Aerosil 130 manufactured by Nihon Aerosil Co. Ltd. (average grain size: about 16 nm) (8 parts by weight) and Nipsil E-220A manufactured by Nippon Silica Industrial Co., Ltd. (average grain size: 1.5 $\mu$m) (8 parts by weight) were added in the mixture and stirred thoroughly. A paint for forming the super-water-repellent surface was thus prepared. Aerosil 130 had a grain size of about 1/94 of Nipsil E-220A.

After dipping a glass plate of 3 cm length, 2 cm width and about 1 mm thickness in the paint, the plate was pulled up at a rate 3 cm/sec from the paint. When the glass plate was heated at 120° C. for 30 min and, successively, at 200° C. for 45 min, a glass plate with a surface having an contact angle with water of 150° or more, that is, with a super-water-repellent surface was prepared.

Photo-irradiation was performed to the surface by a 500 W xenon lamp manufactured by Ushio Electric Co. for 2 min by way of a colored glass filter UV-D 36B manufactured by Toshiba Glass Co. The photo-intensity was 6.6 mW/cm$^2$. Then, the contact angle with water on the surface was lowered to 120°.

Then, after photo-irradiation in the same manner except for changing the glass filter from UV-D-36B to Y-45 manufactured by Toshiba Glass Co., the article was dried at 120° C. for 2 hours. Then the surface the contact angle with water on which was lowered to 120° was returned to the surface showing the super-water-repellency of 150° or more.

The surface on which the contact angle with water was lowered to 120° could be returned to the surface having the super-water-repellency of 150° or more in the same manner as described above by replacing the heating time from 120° C. to 100° C. and the heating time from 2 hours to 6 hours.

Further, the surface on which the contact angle with water was lowered to 120° could be returned to the surface showing the super-water-repellency of 150° or more by changing the heating temperature from 120° C. to 150° C. and the heating time from 2 hours to 3 hours, without photo-irradiation using Y-45.

EXAMPLE 25

Figure 3:
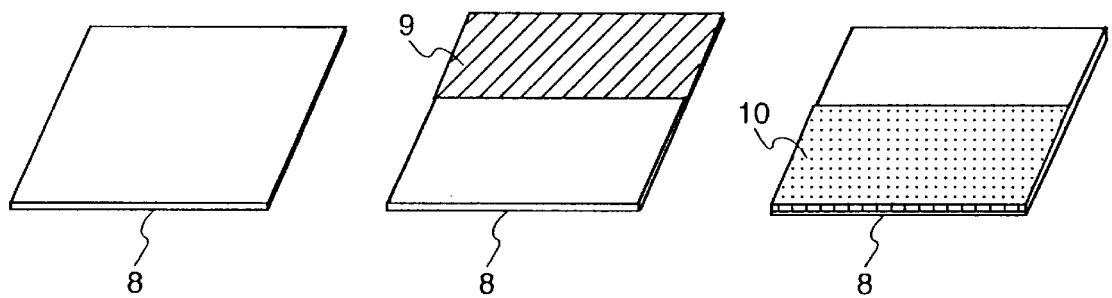
FIG. 3 is an example of printing using an original plate for printing as a surface of an article according to the present invention.

A glass plate having the super-water-repellent surface prepared in example 1 and coated with the compound 12 was provided. A mask 9 was placed on the super-water-repellent surface of the glass plate 8 such that about one-half of the glass surface was covered as shown in FIG. 3.

The mask did not have photo-transparent range of the light at a wavelength of less than 400 nm. After placing the mask, the photo-irradiation was performed in the same manner as in example 1. The mask was removed and the glass plate was contacted with a sponge wetted with 0.1 wt % methyl orange and 0.1 wt % of aqueous ethanol solution. The solution did not adhere to the masked part but the solution adhered to the photo-irradiated part. In FIG. 3, adhered solution is shown as 10. When a usual ink jet printer paper was contacted with the methyl orange solution on the glass plate, the solution transferred to the paper.

EXAMPLE 26

Figure 4:
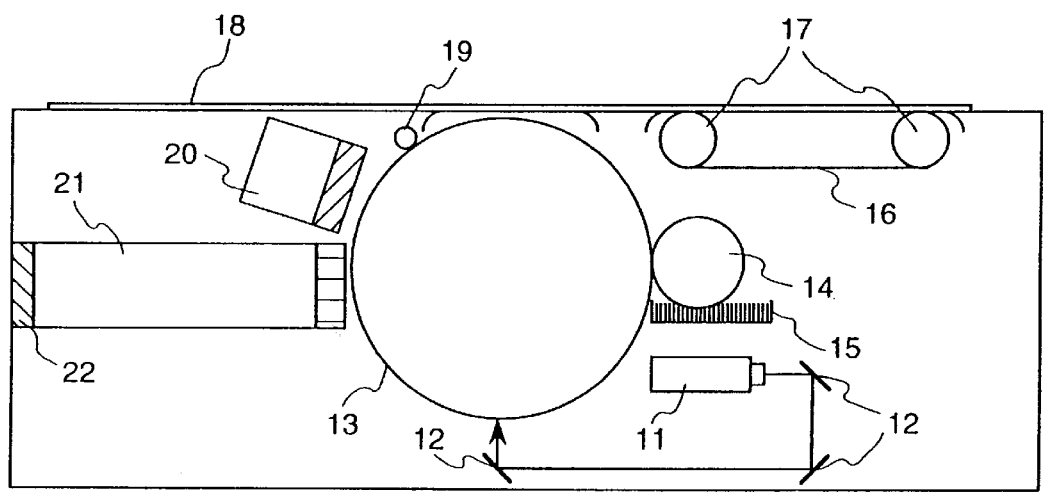
FIG. 4 is a schematic view of a printing machine according to the present invention.

Then, printing experiment was conducted by a printing machine shown in FIG. 4. As a result, it was confirmed that printing was possible by the method.

The principle of the printing machine is as below. Photo-irradiation was performed by using a light source 11 and a mirror 12 to a drum-shaped photoreceptor 13. The method of manufacturing the photoreceptor is to be described later.

A sort of latent images comprising a super-water-repellent part and a not water repellent part was formed on the surface of the photoreceptor. Then, the drum was contacted with an ink drum 14. The ink drum is made of a sponge at a part in contact with the photoreceptor and the part is wetted with the ink. The ink was deposited in contact with the ink drum at a portion of the photoreceptor irradiated with light. However, since the not photo-irradiated part showed the super-water-repellency, the ink did not adhere. Then, the photoreceptor contacted with paper 18, printing was possible by transfer of the ink to the paper.

After transferring the ink to the paper, the photoreceptor was wiped off by a cleaning sponge 19. Further, the surface of the photoreceptor was heated by a drier 20 to 150° C. The heating time was 3 hours. If the heating temperature was set to 100° C., the heating time was set to 24 hours. Subsequently, the photoreceptor was cooled to a room temperature by a blower 21.

The photoreceptor was manufactured by coating and drying a paint for forming the super-water-repellent surface prepared in example 21 to an aluminum cylinder of about 10 cm diameter in the same manner as in example 21. The surface of the cylinder showed the super-water-repellency but the water repellency was lowered upon photo-irradiation at 400 nm or less and the contact angle with water was lowered to 110° like that in example 21.

According to the present invention, it is possible to control the super-water-repellency of an article with a surface having a super-water-repellent surface by photo-irradiation.

What is claimed is:

1. A printing machine comprising an original plate or a photoreceptor, made of a material with a surface having a contact angle with water before photo-irradiation of at least 150°, the contact angle with water being lowered to less than 150° by photo-irradiation, wherein the original plate or the photoreceptor of the printing machine includes a coating of a compound forming an acid or base by undergoing the photo-irradiation, as said surface.

2. A printing machine as defined in claim 1, wherein the original plate or the photoreceptor of the printing machine includes a coating of a photochromic compound as said surface.

3. A printing machine as defined in claim 2, wherein the photochromic compound is a triphenylmethane derivative.

4. A printing machine comprising an original plate or a photoreceptor, made of a material with a surface having a contact angle with water before photo-irradiation of at least 150°, the contact angle with water being lowered to less than 150° by photo-irradiation, wherein the irradiation for changing the contact angle on the surface of the original plate or the photoreceptor of the printing machine is performed using ultraviolet light at a wavelength of less than 400 nm, and wherein the original plate or the photoreceptor of the printing machine includes a coating of a compound forming an acid or base by undergoing the photo-irradiation, as said surface.

5. A printing machine as defined in claim 4, wherein the original plate or the photoreceptor of the printing machine includes a coating of a photochromic compound as said surface.

6. A printing machine as defined in claim 5, wherein the photochromic compound is a triphenylmethane derivative.

* * * * *